(12) United States Patent
Saur-Brosch

(10) Patent No.: US 11,043,916 B2
(45) Date of Patent: Jun. 22, 2021

(54) OSCILLATOR WITH REDUCED ACCELERATION SENSITIVITY

(71) Applicant: KVG Quartz Crystal Technology GmbH, Neckarbischofsheim (DE)

(72) Inventor: Roland Saur-Brosch, Heidelberg (DE)

(73) Assignee: KVG Quarts Crystal Technology GmbH, Neckarbischofsheim (DE)

(*) Notice: Subject to any disclaimer, the term of this patent is extended or adjusted under 35 U.S.C. 154(b) by 0 days.

(21) Appl. No.: 15/573,407

(22) PCT Filed: May 11, 2016

(86) PCT No.: PCT/DE2016/200222
§ 371 (c)(1),
(2) Date: May 8, 2018

(87) PCT Pub. No.: WO2016/180417
PCT Pub. Date: Nov. 17, 2016

(65) Prior Publication Data
US 2018/0302031 A1   Oct. 18, 2018

(30) Foreign Application Priority Data

May 11, 2015  (DE) .......................... 102015107384.6
May 12, 2015  (DE) .......................... 102015107495.8
(Continued)

(51) Int. Cl.
*H03B 5/04*   (2006.01)
*H03B 5/32*   (2006.01)
(Continued)

(52) U.S. Cl.
CPC ................ *H03B 5/04* (2013.01); *H03B 5/32* (2013.01); *H03H 9/02086* (2013.01); *H03H 9/205* (2013.01); *H03B 2200/0022* (2013.01)

(58) Field of Classification Search
CPC ... H03B 5/04; H03B 5/30; H03B 5/32; H03H 9/205
See application file for complete search history.

(56) References Cited

U.S. PATENT DOCUMENTS 4,410,822 A * 10/1983 Filler ....................... H03H 9/58
                                                                29/25.35
4,575,690 A *  3/1986 Walls ....................... H03B 5/32
                                                                331/116 R
(Continued)

OTHER PUBLICATIONS

STMicroelectronics, "AN2867: Application Note", Mar. 30, 2011 (Year: 2011).*

*Primary Examiner* — Ryan Johnson
(74) *Attorney, Agent, or Firm* — Mersenne Law

(57) ABSTRACT

The invention relates to an oscillator comprising two resonators, the direction of the vector of acceleration sensitivity of at least one first resonator of the at least two resonators, said direction being relative to the mounting surface of said first oscillator, corresponding substantially to the reflected direction that is reflected by a mirror plane of the vector of acceleration sensitivity of at least one second resonator of the at least two resonators, said direction being relative to the mounting surface of said second oscillator. The invention also relates to an oscillator comprising two resonators, the oscillator comprising a resistor which is effectively connected in parallel with one of the resonators and the resistance value of which is less than a hundred times that of the series resonator resistance of the combined resonator at the desired resonant frequency.

17 Claims, 4 Drawing Sheets

(30) Foreign Application Priority Data

Sep. 29, 2015 (DE) .......................... 102015116529.5
Oct. 2, 2015 (DE) .......................... 102015116815.4

(51) Int. Cl.
*H03H 9/205* (2006.01)
*H03H 9/02* (2006.01)

(56) References Cited

U.S. PATENT DOCUMENTS

| | | | |
|---|---|---|---|
| 8,188,800 B2 * | 5/2012 | Fry ................... | H03H 9/02086 |
| | | | 310/348 |
| 2009/0201096 A1 * | 8/2009 | Hardy ................. | G01P 15/097 |
| | | | 331/107 A |
| 2015/0263672 A1 * | 9/2015 | Fry ................... | H03H 9/02086 |
| | | | 331/66 |

* cited by examiner

OSCILLATOR WITH REDUCED ACCELERATION SENSITIVITY

CONTINUITY AND CLAIM OF PRIORITY

This is a U.S. national-phase patent application filed under 35 U.S.C. § 371, claiming priority to international patent application number PCT/DE2016/200222 filed 11 May 2016 and German patent applications DE102015107384.6 filed 11 May 2015, DE102015107495.8 filed 12 May 2015, 102015116814.4 filed 2 Oct. 2015 and DE102015116529.5 filed 29 Sep. 2015.

FIELD

The invention relates to oscillators with reduced acceleration sensitivity, and to methods for reducing the acceleration sensitivity of oscillators.

BACKGROUND

In the past it has been shown that the acceleration sensitivity of oscillators can be reduced, when several resonators are used in which magnitudes and directions of the vectors are substantially the same.

SUMMARY

The invention shows that the reduction of the acceleration sensitivity can be improved by a special selection and arrangement of resonators, where the direction of the vector of the acceleration sensitivity (FIG. 1-5; 'm', 'x', 'y', 'z'), relative to its mounting surface (FIG. 1-5; 's'), of at least one first resonator of the at least two resonators substantially corresponds to the direction of the vector of the acceleration sensitivity, relative to its mounting surface, of at least one second resonator of the at least two resonators, mirrored at a mirror plane and that said first resonator is arranged in a mechanically rotated manner relative to said second resonator, preferably rotated by 180° around the axis (FIG. 1-5; 'r') which is perpendicular to said mirror plane, and that said mirror plane is perpendicular or parallel to the mounting plane.

DETAILED DESCRIPTION

Figure 1:
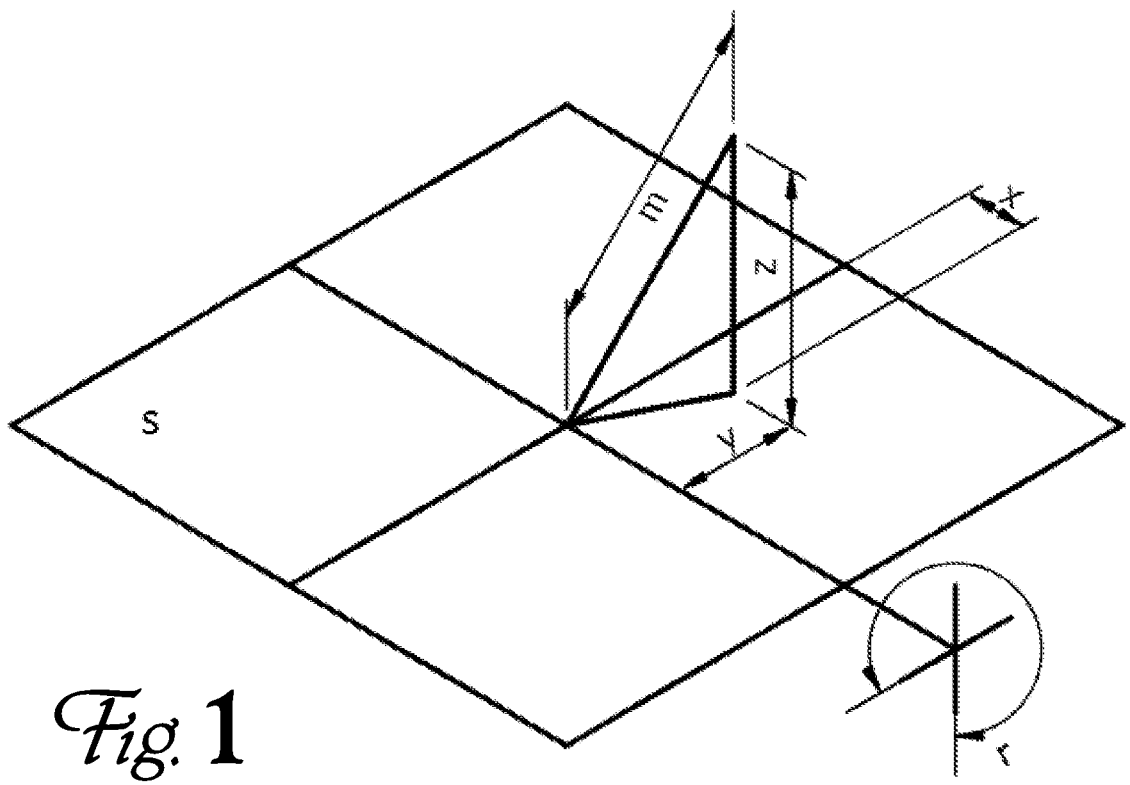
FIG. 1 depicts a typical resonator represented by its substantially square mounting surface (s) and by the vector representing an arbitrary acceleration sensitivity with a magnitude (m) and a direction with its coordinates (x, y and z). Also shown is a rotation axis (r), which is parallel to the mounting surface of the resonator.

The invention relates to oscillators with reduced acceleration sensitivity, and to methods for reducing the acceleration sensitivity of oscillators.

Electronic oscillators are commonly used to generate frequencies.

In order to control the frequency, resonators are usually used, which are coupled to the electronic oscillator.

For example, quartz crystals are used as resonators. However, other crystals are also used, for example lithium tantalate, lithium niobate and many more.

If a resonator is subjected to an acceleration force, its characteristic frequency changes and consequently so does the frequency of the oscillator controlled by the resonator.

In certain fields of applications, a dependence of the frequency on the acceleration force (acceleration sensitivity) is undesirable because it can lead to undesirable frequency changes.

For example, this is the case when used in vehicles, aircraft and other non-stationary applications.

Other examples of such cases are environments with rotary or vibrating masses.

U.S. patent application Ser. No. 12/613,336, filed on Nov. 5, 2009, describes how the acceleration sensitivity can be reduced, when several resonators are used in which magnitudes and directions of the vectors are substantially the same.

Reference is made to the corresponding specification in the cited application in its entirety.

In the course of the invention, however, it has now been found, surprisingly, that the acceleration sensitivity can be reduced to a particularly high extent, when two resonators which are arranged mechanically in an antiparallel manner, for example by being rotated 180° with respect to each other around at least one axis, are produced or selected from a larger number of resonators, characterized in that the magnitudes of the vectors of the acceleration sensitivity are substantially the same, the direction of the vector of one of the two resonators being mirrored with respect to the direction of the other resonator at the plane, which is perpendicular to said axis. This is proposed in a preferred embodiment of the invention.

In this case, it is surprisingly even possible to achieve a better anti-parallel alignment of the vectors than with the use of resonators whose vectors point in substantially the same direction, which is why a preferred embodiment of the invention proposes this.

Especially if the vectors are not substantially perpendicular to the axis around which at least one of the resonators is rotated with respect to at least one of the other resonators, such an embodiment results in a particularly good anti-parallel alignment of the vectors.

Preferably, the usable range of the angles of the vectors can be enlarged by using such embodiments, whereby the yield in the production preferably can be increased.

In a further preferred embodiment, the accuracy of the anti-parallel alignment of the vectors is improved.

When using resonators with which the size of the vectors is substantially the same, although the direction of the vectors is not or need not be the same, but with which the direction of the vector of one of the two resonators is mirrored with respect to the direction of the vector of the other resonator, at the plane, which is perpendicular to this axis, the angular range, which the directions of the vectors may have, in order to achieve an orientation of the vectors as anti-parallel as possible or an anti-parallel alignment with a certain maximum deviation of the vectors due to antiparallel alignment of the resonators or their mounting surface, is enlarged, which is why a preferred embodiment of the invention proposes this.

In the following, a resonator which is mounted in a housing is also referred to as a resonator.

This can be, for example, a housing made of ceramic, but also one made of metal.

The directions of vectors are related to the resonator housing when the resonators are mounted in such housings.

Figure 2:
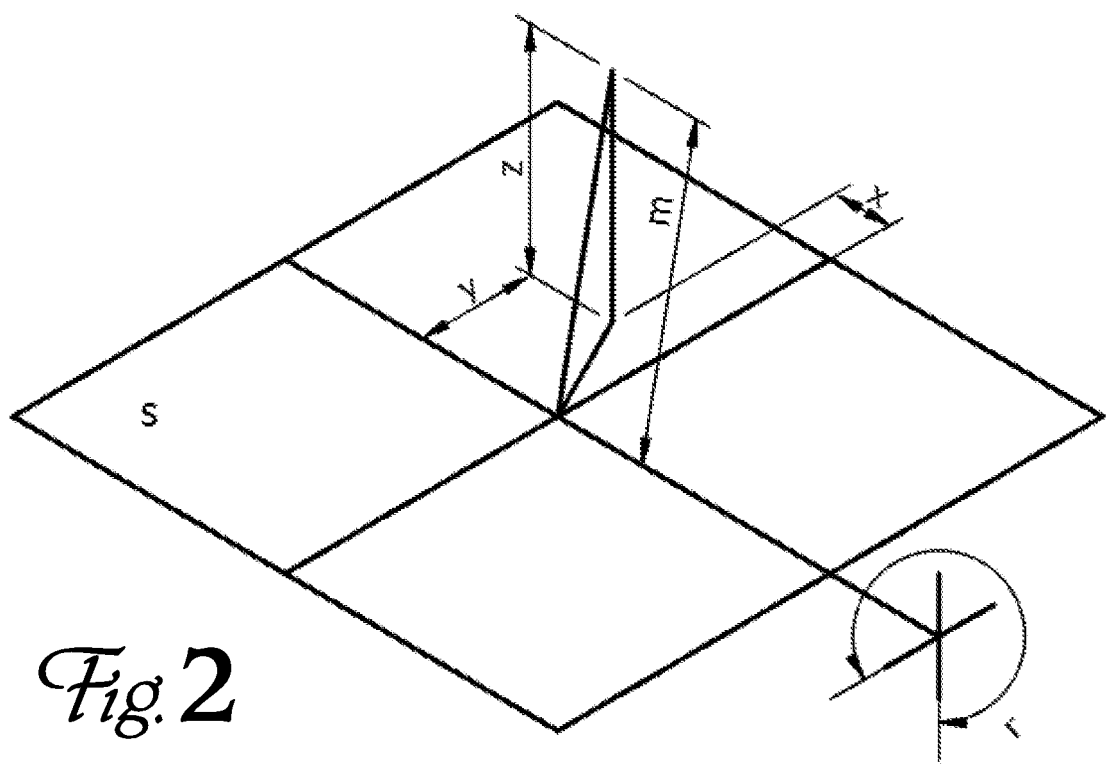
FIG. 2 depicts a similar resonator as the one depicted in FIG. 1, with the vector of acceleration sensitivity not having the same direction as the resonator shown in FIG. 1, but only having a matching direction when mirrored at a mirror plane which is perpendicular to the rotation axis (r).
Figure 3:
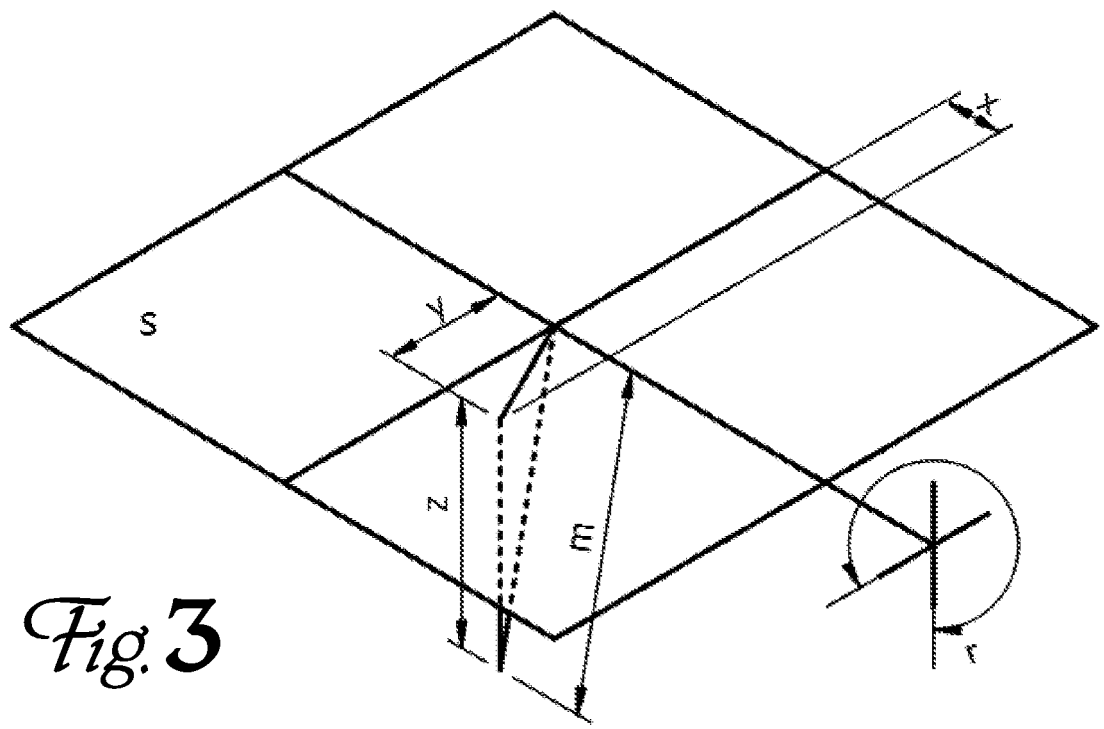
FIG. 3 depicts the resonator shown in FIG. 1, but the resonator is shown rotated by 180° around the rotation axis (r).
Figure 4:
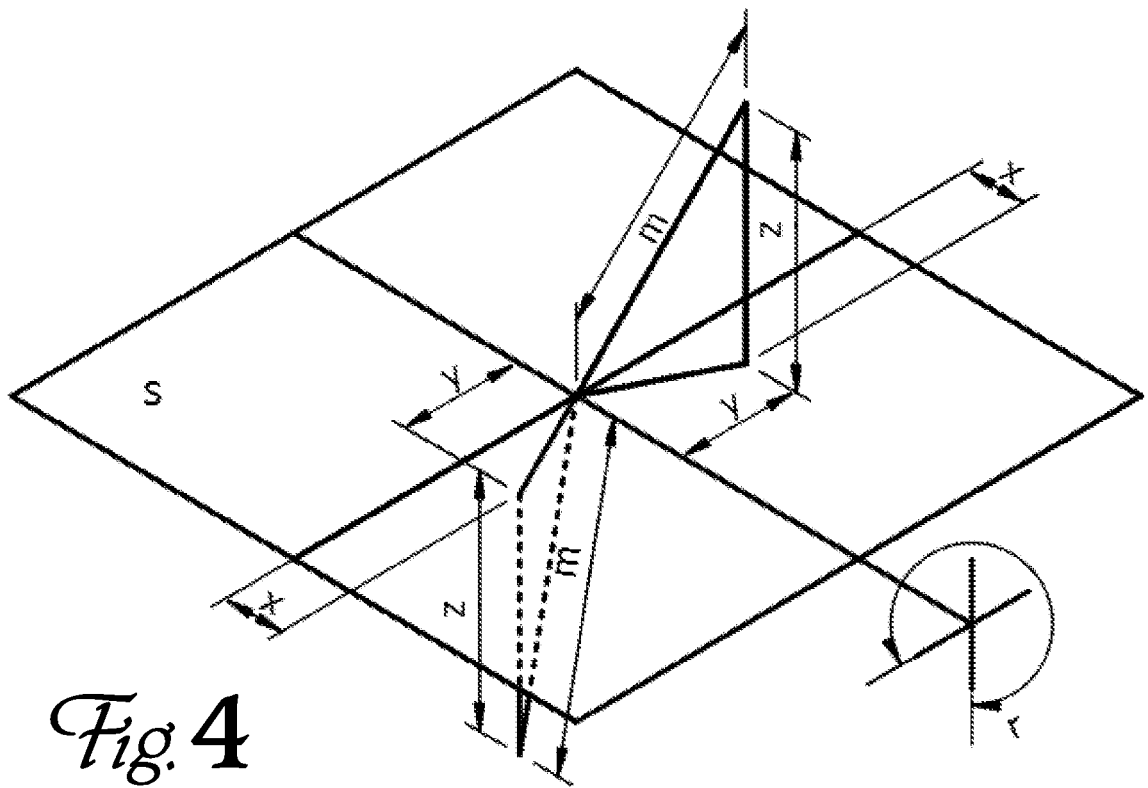
FIG. 4 depicts an overlay of the resonators of FIG. 1 and FIG. 3.
Figure 5:
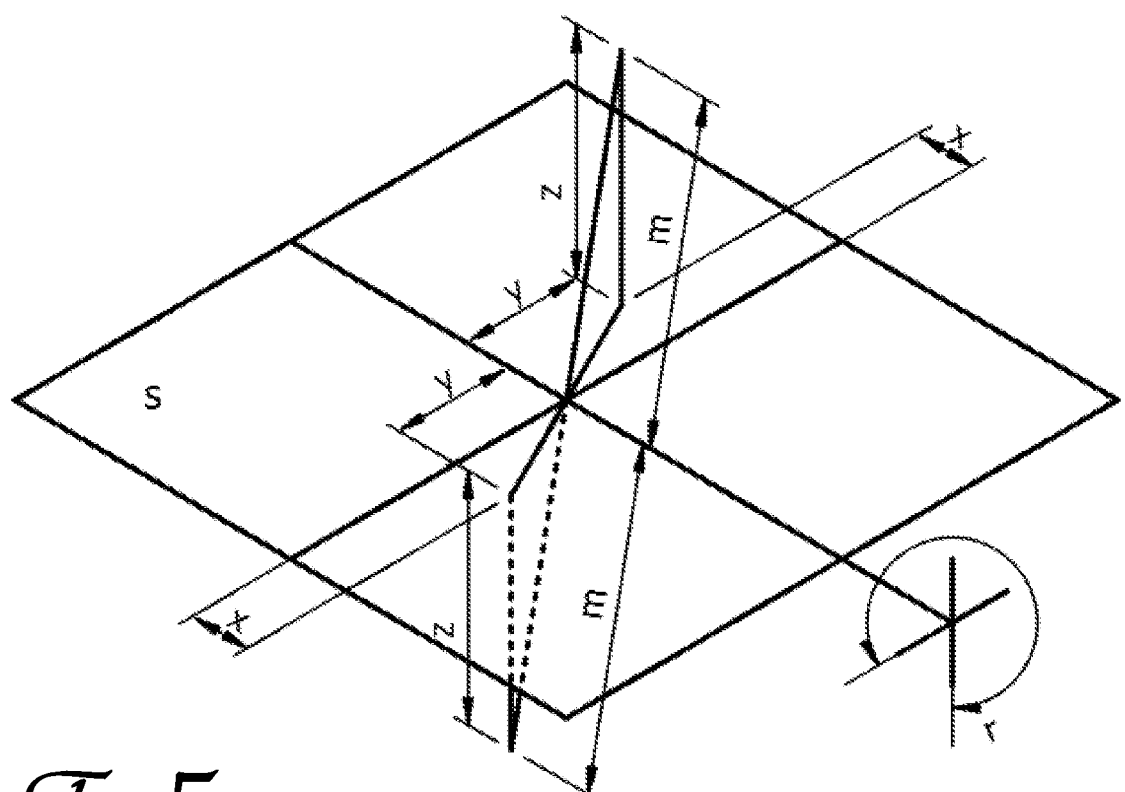
FIG. 5 depicts an overlay of the resonators of FIG. 3 and FIG. 2.
Figure 6:
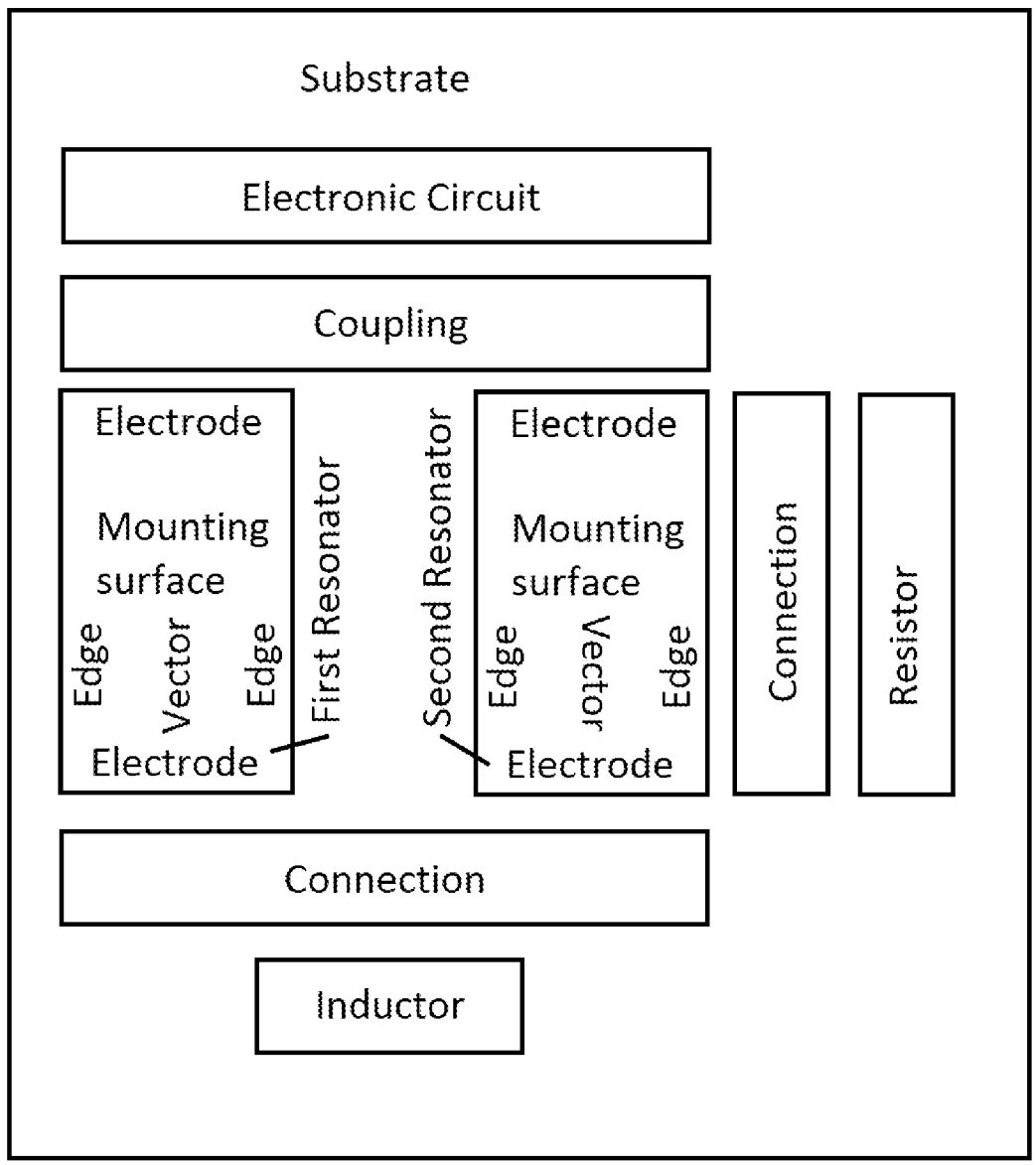
FIG. 6 is a block diagram showing features of an embodiment that are specified in the claims.

The axis (FIG. 1-5; 'r'), around which at least one of the resonators is mechanically rotated by 180° with respect to at least one other, is preferably located in a plane which is parallel to the mounting surface (FIG. 1-5; 's') of one of the resonators.

More preferably, this axis (FIG. 1-5; 'r') is parallel to an edge of one of the resonators, or to an edge of the housing in which one of the resonators is mounted.

In a further embodiment, the invention proposes that the mounting surfaces (FIG. 1-5; 's') of the resonators are substantially square and that the electrical connections either on the resonators or on the substrate or on the substrates, are preferably realized in a way that an arrangement is possible in which a resonator can be mounted in a rotated manner by 90° around the axis perpendicular to the mounting surface.

It is then possible to choose a diagonal through the mounting surface or a parallel to it as the axis, around which one of the resonators is rotated by 180° with respect to one of the other resonators.

In a further embodiment, the invention proposes that the electrical connections, either on the resonators or on the substrate or on the substrates, preferably are carried out in such a way that an arrangement is possible with which at least one resonator can be mounted in at least two different orientations, which are rotated with respect to one another around the axis perpendicular to the mounting surface, whereas the electrical coupling is substantially independent of the choice of the respective orientation.

As a result, it is possible, to rotate the axis, around which the resonator is rotated with respect to another resonator, around the axis perpendicular to the mounting surface.

For example, a resonator is constructed in such a way that it is rotationally symmetrical, with a rotation by 180° around the axis perpendicular to its mounting surface.

If this resonator is rotated by said 180° around the axis perpendicular to its mounting surface, this effectively results in a rotation of the axis, around which it is rotated by 180° with respect to another resonator, by 90° perpendicular to the mounting surface.

This makes it possible, for example, for resonators to be able to be combined with each other, with which the directions of the vectors of the acceleration sensitivity are mirrored at a plane which is not perpendicular to the axis, around which the terminals for the mounting of the rotated resonator are arranged in a rotated manner, but which is rotated by 90° around the axis perpendicular to the mounting surface.

A further variant of such an embodiment provides a substrate on which the electrical terminals for at least one resonator are repetitive, wherein the terminals each are repeatedly rotated around an axis, which is located substantially in the center of the resonator perpendicular to the mounting surface.

Preferably, the repetitive terminals are arranged rotated with respect to each other, in each case by a certain angle. More preferably, this angle corresponds to a divisor of 360°.

Particularly preferred are angles of 22.5°, 30°, 45°, 60° and 90°. For example, the terminals are provided four times, wherein in each case a rotation by 22.5° is carried out.

The resonator can thus be arranged rotated by 0°, 45°, 90° and 135°.

If the resonator is further realized so that it can be rotated by 180° around its vertical axis, without causing it to behave substantially electrically different (apart from the acceleration sensitivity), it can also be arranged effectively rotated by 180°, 225°, 270° and 315°.

In such embodiments, the axis, around which the resonators are effectively rotated by 180° with respect to one another, can be rotated around the axis, which is perpendicular to the mounting surface, if applicable in several steps.

As a result, the plane which is perpendicular to the axis around which the resonators are rotated with respect to one another is also rotated around the axis which is perpendicular to the mounting surface.

This makes it possible to select resonators with which the plane, at which the direction of the vector of one of the two resonators is mirrored with respect to the direction of the other resonator, is not perpendicular to an outer edge of one of the resonators, but with respect to it is rotated around an axis which is perpendicular to its mounting surface.

In further embodiments, at least one resonator, but not all of the resonators, is already rotated around an axis by 180° during assembly into the resonator housing. In such embodiments, this rotation can be omitted with the arrangement of the resonators on the substrate or the substrates. If the axis, around which the resonator is rotated by 180° within its housing, is located parallel to the plane of its mounting surface, it can be rotated accordingly by the above-described rotation of a resonator around the axis which is perpendicular to its mounting surface. This results in the advantage that, during the assembly of the resonators which have already been mounted into the housing in a rotated manner, the axis can be determined independently of the direction of the vector of the acceleration sensitivity.

In further embodiments, the axis around which at least one of the resonators is mechanically rotated relative to at least one other is perpendicular to the mounting surface of one of the resonators.

In further embodiments, said plane is parallel or perpendicular to the mounting surface.

This advantageously results in that the mounting surfaces of the resonators being preferably parallel to one another.

The advantage that the mounting surfaces of the resonators are parallel to one another also results in the case with which the axis, around which at least one of the resonators is rotated by 180° with respect to another one, is parallel or perpendicular to the mounting surface, which is why this is proposed in a further embodiment.

In further embodiments, it is proposed to realize at least one of the resonators in a way that its mounting surface is circular. This has the advantage that, even in the event of rotations of the resonator around the axis, which is perpendicular to its mounting surface, which are smaller than 90°, no substantial displacements of the mass (in particular of the thermal mass) occur and the space required for the resonator on the substrate is minimized.

It has been found that, if a plurality of resonators are combined to form a combined resonator (combined frequency-determining element), the influence of the individual resonators on the frequency of the desired mode of the combined resonator is inversely proportional to their pullability. A resonator which is connected to a second resonator to form a combined frequency-determining element, which has twice the pullability, has twice as much influence on the frequency of the combined mode.

In order that the frequency of the combined mode is influenced as little as possible when the same acceleration acts on both resonators, it is advantageous, if it is not the magnitudes of the vectors of the acceleration sensitivity that are substantially equal, but the two products from the respective magnitude of the vector of the acceleration sensitivity and the respective relative proportion of the determination of the frequency.

The magnitude of the vector of the acceleration sensitivity of a resonator, whose relative proportion of the determination of the frequency is twice as high as that of a second resonator to be combined with it, thus has to be substantially half as large as that one's magnitude of the vector of the acceleration sensitivity.

In further embodiments, it is therefore proposed that the magnitudes of the vectors of the acceleration sensitivity of the resonators are substantially in the same proportion to each other, as are their pullabilities with respect to one another. In the case of differing pullabilities, the resonators therefore have correspondingly differing magnitudes of the acceleration sensitivity.

Many oscillator circuits are constructed asymmetrically around the resonator. This means, that the electronic circuit on both sides of the resonator is not the same, but is different. For example, one terminal of the resonator is connected to the output of an amplifier and the other terminal to the input of this amplifier. Thus, the terminal impedances on both sides of the resonator are often different. Inter alia, due to such asymmetries, the ratio of the influences of the individual resonators of the combined frequency-determining element may differ from the ratio of the reciprocal values of their pullabilities. In particular, this is due to the fact that several combined resonators, for example combined by electrical series-connection, do not just represent a simple series-connected circuit, but that most of the times there also occurs a parasitic capacitance to other nodes of the electrical circuit at their connection point. Depending on the realization of the oscillator circuit, this parasitic capacitance can reduce the influence of one of the resonators to the frequency of the combined mode to a greater extent, than that of the other resonator or of the other resonators.

In order to take this into account, it is provided in further embodiments that the magnitudes of the vectors of the acceleration sensitivity of the resonators are substantially in the same proportion to one another, as the reciprocal of their pullability in the oscillator circuit with respect to one another.

A further possibility is to compensate for the parasitic capacitances at the connection points of the individual resonators by parallel connection of inductances. Preferably, from at least one node, where two resonators are connected to each other, an inductance is connected to the node, to which also the parasitic capacitance of the connection point is formed. This is usually the circuit ground. The value of the inductance is chosen substantially in a way that, together with the parasitic capacitance, a resonant circuit with a parallel resonance results at or in the vicinity of the frequency of the desired mode of the combined frequency-determining element, which is proposed in a further embodiment.

The resonators are preferably coupled directly, that is without other interconnected circuit elements, in order to achieve a combination of the desired modes that is as low-loss as possible. However, the coupling can also be effected by means of reactive components, since they have only a very low damping. For example, the coupling can be made via inductances, capacitances, elements with capacitance-varying barrier layers, for example capacitance diodes, field-effect transistors connected as capacitance-variable elements, etc. arranged between the frequency-determining elements.

The coupled elements form a combined frequency-determining element, whose desired mode, or its desired modes lie between the modes of the used frequency-determining elements lying within the immediate vicinity. The position of the combined mode (or the combined resonance) between the modes within immediate vicinity, is determined by the ratio of their respective pullability (variability of the resulting resonant frequency by means of circuitry with preferably variable reactances). The higher-frequency mode effectively acts as a pulling capacitance for the other mode, and the other mode acts as a pull inductance for it.

With many frequency-determining elements, for example crystal resonators, a signal transmission does not only occur at or in immediate vicinity of the frequencies of the oscillation modes, but also a normally undesirable signal transmission due to certain physical effects, like, for example, the static (parasitic) capacitance of crystal resonators.

Usually, frequency-determining elements are represented in electronic circuits with their electrical equivalent circuit diagram, which usually consists of an inductance (L1) which represents the kinetic mass of the mechanical equivalence model, a capacitance (C1) which represents the elasticity of the mechanical equivalence model, and a resistor (R1) which represents the losses, for example the internal friction losses, of the mechanical equivalence model.

In addition, the described undesirable signal transmission has to be implemented, which is usually realized in the form of an additional parasitic capacitance (C0).

In most cases, the electrical equivalent circuit represents a series circuit of the three main elements (L1, C1 and R1) to which the parasitic capacitance (C0) is connected in parallel.

If several frequency-determining elements which have desired and undesirable modes are now coupled, in which, however, only the desired modes of both frequency-determining elements lie in immediate vicinity, it can occur, as a result of the undesirable signal transmission, which is represented by the parasitic C0, that undesired modes of one of the frequency-determining elements also become dominant (i.e. have lower damping) with respect to the desired combined mode or modes.

Although the small size of the parasitic C0 results in a frequency displacement similar to the pulling effect caused by a pulling capacitance, however, the damping of the undesirable mode is, in some circumstances, only slightly increased (transformation of R1 into R1', see "Das Quarzkochbuch", Bernd Neubig).

Since the attenuations of the desired modes of two frequency-determining elements are added up, it can occur that due to the influence of C0 undesirable modes have a lower overall damping than the desired mode or modes.

Even if the overall damping is greater than that of the desired combined mode, it can occur that components of these undesired frequencies are present in the output signal of the oscillator.

Likewise, it can occur that the modes of individual frequency-determining elements, which together form the desired mode of the combined frequency-determining element, occur as unwanted modes in the combined frequency-determining element, due to the coupling of the C0 of other frequency-determining elements.

Modes of this type, which arise when modes of individual elements, which are parts of the desired mode of the combined frequency-determining element, are coupled via parasitic capacitances of other elements, are hereafter also referred to as undesirable modes.

If for example, two frequency-determining elements are coupled, which each have a desired mode with a series resonance of 10 MHz, which, however, also have a parasitic parallel capacitance C0, and the pulled series resonance ow which, in the case of a series circuit of the individual elements with a pulling capacity at the level of the C0 of the other element, lies, for example, at 10.001 MHz, this results in a combined frequency-determining element with one mode at 10 MHz and two modes at approx. 10,001 MHz.

Depending on the other parameters of the equivalent circuit elements (R1, L1, C1), these modes have certain effective series resonance resistances, with the series resonance resistance of the desired mode at 10 MHz being the sum of the series resonance resistances of the desired modes of both elements, the series resonance resistance of the unwanted modes being the transformed series resonance resistance with use of a pulling capacitance according to the C0 of the respective other element.

In some circumstances, it can occur that the series resonance resistances of such undesired modes are lower than the series resonance resistance of the desired mode, or at least so low that corresponding undesirable frequencies are present in the output signal.

In such cases, it may be desirable to suppress such undesirable modes, as it can also be the case with other undesirable modes.

Since a parallel resonant circuit has only a very low signal transmission in the vicinity of its resonant frequency, the invention proposes in one variant that to at least one frequency-determining element at least one inductance is connected in parallel, which is in parallel resonance with the C0 of this element in the vicinity of one or more modes of the other or one of the other frequency-determining elements, in order to increase the damping of the undesired mode or modes, or to increase the damping of the modes that arise by coupling of modes actually desired via the C0 of other elements.

In the event that both frequency-determining elements have undesirable modes, which, in interaction with the parasitic C0 of the other or one of the other frequency-determining elements, can represent according low-loss resonances, the invention proposes in a further variant that corresponding inductances are connected in parallel to several or to all frequency-determining elements.

In order to achieve a certain reserve with respect to manufacturing tolerances in the resonators, it can also be advantageous to connect corresponding inductances in parallel in general to several or to all frequency-determining elements.

Since inductances are used reluctantly in electronic circuits, i.e. because of their unfavorable temperature behavior, the relatively high price and the non-negligible space requirement, an alternative method for suppressing the parasitic coupling has been sought.

It has been found that, by means of a resistor, which is connected in parallel to at least one of the frequency-determining elements, or to a series circuit of at least one of the frequency-determining elements and at least one reactance, for example, a coupling and/or pulling capacitance, the damping of undesirable oscillation modes can be increased to a greater extent, than the damping of the desired oscillation mode or modes.

The invention therefore proposes in a further variant, to connect a resistor in parallel to at least one of the frequency-determining elements, either directly, or also via one or more reactive elements (inductances and/or capacitors) so that it is effectively connected to it in parallel.

Since resistors can usually be produced cost-effectively, with small dimensions and with good temperature behavior, this variant means a significant improvement of the invention.

Furthermore it has been found, that the ratio of the damping of undesirable modes to the damping of desired modes is particularly advantageous, when the resonators are operated as close as possible to the series resonance of the desired mode. In order to dampen the desired modes as little as possible, the invention proposes in a further variant, that the crystal resonators or other resonators are operated as close as possible to the series resonance of the desired mode, preferably at a distance from the series resonant frequency of less than 30% of the distance of the parallel resonance from the series resonant frequency, more preferably at a distance of less than 10%, even more preferably less than 5% and particularly preferably at a distance of less than 2%.

An application of the invention consists, for example, of a quartz oscillator, which is equipped with an oscillating crystal, which is realized with an SC cut.

Crystal resonators, which are based on an SC cut, have at least 2 modes, which differ in frequency by approximately 9%, and with which the lower mode (C-mode) is preferred to the higher mode (B-mode), since it has an advantageous temperature behavior.

Due to the relative proximity of the two modes, some circuit complexity is required, in order to induce only the desired mode for oscillation, as it has already been explained in the description of the state of the art. For this, sometimes several inductors are used, the disadvantages of which have already been explained.

Also, crystal resonators not only have other types of oscillation modes (C-mode, B-mode, etc.), but also modes at different harmonics or overtones. Since higher overtones are often used for certain reasons (for example better aging behavior), but lower overtones usually have lower dampings, a further selection must often be installed, which further increases the complexity of the electronic circuit, for example by using further inductances. The exemplary realization of such an oscillator using the method according to the invention is illustrated in the following example.

By coupling the third overtone SC cut crystal resonator, which has one desired mode at 10 MHz (series resonant resistance 40 ohm) and two low-loss undesired modes at 3.333 MHz (series resonance resistance 20 ohm) and 10.9 MHz (series resonance resistance 35 ohm), with a further crystal resonator being AT cut in the fundamental mode, which has a desired mode at 10 MHz (series resonance resistance 10 ohm), but has no undesirable modes in the vicinity of 3.333 MHz or 10.9 MHz, a combined frequency-determining element is formed, which has combined modes at approximately 3.333 MHz, 10 MHz and approximately 10.9 MHz, whereby the two undesired modes are now damped to a greater extent. The series resonance resistance at 10 MHz is 50 ohms. In addition, the combined element has a further mode, which is a few ppm above 10 MHz (series resonance resistance 48 ohm).

By connecting a resistor with 1000 ohms parallel to the AT cut crystal resonator, the damping of the undesired modes increases significantly, with a negligible increase in the damping of the desired mode.

In such cases, this makes it possible to dispense with any inductances in the electronic circuit.

In the case of undesirable spurious resonances, which occur, for example, in the case of crystal resonators depending on the electrode size, the damping means can be used equivalently.

Even if the parasitic capacitance(s) is at least partially compensated for, for example, with the aid of inductances in the range of the desired mode or modes, for example in order to enable a more linear frequency modulation by means of further variable reactances used in the oscillator circuit, it can happen that one or more undesired modes have a lower damping than the desired mode, or that an oscillation occurs in an undesired mode together with the oscillator circuit.

In a further variant of the invention, it is therefore proposed to connect a resistor in parallel to at least one of the frequency-determining elements, either directly or via one or more reactive elements connected in series thereto (for example inductances and/or capacitors), in addition to the above-described inductances.

In the course of the invention, it has been found that it is advantageous, if the resistance value of the resistor or resistors is preferably dimensioned so low that a substantial damping of the undesired mode is achieved.

The damping of the desired mode should preferably be as low as possible.

In other words, the quality factor of the undesired mode or modes should be reduced as much as possible, but the quality factor of the desired mode or modes as little as possible.

Particularly preferably, the resistance value of a parallel-connected resistor is at most by a factor of 100 above the series resonance resistance of the desired mode of the combined frequency-determining element, because a resulting degradation in the quality factor of approximately 1% is almost always tolerable and, in the case of very high factors, for example 1000 and above, in most cases no substantial damping of undesired modes is achieved.

Particularly preferably, the resistance value of a resistor connected in parallel is at most by a factor of 30 above the series resonance resistance of the desired mode, because a resulting degradation in the quality factor of approximately 3% is usually tolerable and a better damping of undesired modes is achieved.

In order not to degrade the quality factor of the desired mode too much, the resistance value of a parallel-connected resistor is preferably at least by a factor of 5 above the series resonance resistance of the desired mode. The resulting degradation of the quality factor by approximately 20% is in the range of common manufacturing tolerances of resonators, so that, in the case of factors below 5, the degradation of the quality factor can be unacceptable for certain applications.

However, the factor can also be selected to be lower than 5, for example in the range from 2 to 5, for example, if the degradation of the quality factor is tolerable, or if with higher factors an adequate damping of the undesired modes cannot be reliably achieved.

Particularly preferably, the resistance value of a parallel-connected resistor is preferably at least by a factor of 10 above the series resonance resistance of the desired mode, so that an as high as possible quality factor of the desired mode can be maintained.

Values from 15 to 25 times the series resonance resistance of the desired mode have been found to be particularly advantageous.

The aforementioned resistor can be both a pure ohmic resistor, for example a component having a current path made of a material which has a higher resistivity than copper, in particular of a nickel-chromium alloy or of a metal oxide-containing paste (thick-film resistor), fired onto a ceramic substrate, as well as a variable resistor like, for example, a field-effect transistor connected as a controllable resistor.

By using a variable resistor, it is possible to adjust the damping, if applicable depending on specific properties of the resonator, on the ambient temperature or other parameters which can influence the frequency-determining elements of the circuit. This represents a further variant of the invention.

The described possibilities for combining several resonators to form a combined frequency-determining element can also be used regardless of a reduction of the acceleration sensitivity, for example for the selection of specific desired modes or for suppressing undesirable modes of otherwise individually used resonators or in resonators which are combined for other reasons.

As much as they are not obviously mutually exclusive, the features proposed in various embodiments are also applicable and to be regarded as embodiments of the invention in combinations which are not explicitly listed.

In particular, the described measures for a more advantageous selection of desired modes, or for suppression of undesirable modes, can be used independently of the mechanical arrangements of the resonators.

I claim:

1. An oscillator comprising:
an electronic circuit, supported by a substrate or a plurality of substrates coupled to one another, and configured to initiate and obtain periodic oscillations; and
a first resonator supported by at least one of the substrates, the first resonator having a first mounting surface and a first acceleration sensitivity described by a first vector having a first vector magnitude and a first vector direction relative to the first mounting surface; and
a second resonator supported by at least one of the substrates, the second resonator having a second mounting surface and a second acceleration sensitivity described by a second vector having a second vector magnitude and a second vector direction relative to the second mounting surface, wherein
the first and second resonators are operatively coupled to the electronic circuit and function as a combined resonator, in order to control a frequency of the periodic oscillations to achieve a desired resonance frequency, and wherein the second mounting surface is arranged substantially parallel to the first mounting surface,
and
the resonators are arranged with reference to a mirror plane and a first rotation axis,
characterized in that,
with the resonators equally oriented, the first vector direction substantially matches the second vector direction, when the second vector direction is mirrored at said mirror plane
and that
said first resonator is arranged in a mechanically rotated manner relative to said second resonator, rotated by 180° around said first rotation axis and that said first rotation axis is perpendicular to said mirror plane, and that
said mirror plane is perpendicular or parallel to the mounting surface of one of said resonators.

2. Oscillator according to claim 1, characterized in that said mirror plane is parallel to an edge of said first resonator or to an edge of said second resonator.

3. Oscillator according to claim 1, characterized in that said mirror plane is perpendicular to the mounting surface of one of said resonators,
and that
said mirror plane is rotated by 45° with respect to an edge of said first resonator or to an edge of said second resonator, wherein said rotation by 45° is around a normal to the mounting surface of one of said resonators.

4. Oscillator according to claim 1, characterized in that the first resonator has a first frequency pullability and the second resonator has a second frequency pullability; and
the first vector magnitude is not substantially equal to the second vector magnitude; and
the oscillator has a magnitude ratio being the ratio of the first vector magnitude to the second vector magnitude and the oscillator has a pullability ratio being the ratio of the first frequency pullability to the second frequency pullability and wherein the magnitude ratio is substantially equal to the pullability ratio.

5. Oscillator according to claim 1, characterized in that said first and second resonator are connected to form a common resonator by being connected effectively in series; and
the combined resonator has a series resonance resistance; and
the oscillator comprises at least one resistor which is effectively connected in parallel to one of the resonators, and in that
a resistance value of said resistor is less than one hundred times the series resonance resistance of the combined resonator at the desired resonance frequency.

6. An oscillator according to claim 1, characterized in that the oscillator exhibits an effective parasitic capacitance that occurs between an inter-resonator connection point and another node of the electrical circuit, the oscillator further comprising: a compensating inductor connected between the inter-resonator connection point and the another node of the electrical circuit, an inductance of said compensating inductor in combination with the effective parasitic capacitance forming a resonant circuit having a parallel resonance at or near the desired resonance frequency.

7. Oscillator according to claim 1, characterized in that the first and second vector directions are not substantially perpendicular to the first rotation axis.

8. An oscillator according to claim 5, characterized in that the resistance value is at least by a factor of 2 above the series resonance resistance of the combined resonator at the desired resonance frequency.

9. Oscillator according to claim 4, characterized in that the first and second vector directions are not substantially perpendicular to the first rotation axis.

10. An oscillator according to claim 8, characterized in that
the first resonator has a first frequency pullability and the second resonator has a second frequency pullability; and the first vector magnitude is not substantially equal to the second vector magnitude; and the oscillator has a magnitude ratio being the ratio of the first vector magnitude to the second vector magnitude and the oscillator has a pullability ratio being the ratio of the first frequency pullability to the second frequency pullability and wherein the magnitude ratio is substantially equal to the pullability ratio.

11. An oscillator according to claim 6, characterized in that
the first resonator has a first frequency pullability and the second resonator has a second frequency pullability; and the first vector magnitude is not substantially equal to the second vector magnitude; and the oscillator has a magnitude ratio being the ratio of the first vector magnitude to the second vector magnitude and the oscillator has a pullability ratio being the ratio of the first frequency pullability to the second frequency pullability and wherein the magnitude ratio is substantially equal to the pullability ratio.

12. An oscillator according to claim 10, characterized in that
the first and second vector directions are not substantially perpendicular to the first rotation axis.

13. Oscillator according to claim 6, characterized in that the first and second vector directions are not substantially perpendicular to the first rotation axis.

14. Oscillator according to claim 8, characterized in that the first and second vector directions are not substantially perpendicular to the first rotation axis.

15. Oscillator according to claim 11, characterized in that the first and second vector directions are not substantially perpendicular to the first rotation axis.

16. Oscillator according to claim 15, characterized in that the mirror plane is parallel to an edge of at least one of said resonators, or rotated by 45° around a normal to the mounting surface of one of said resonators with respect to said edge, and that the another node of the electronic circuit, to which said compensating inductor is connected to, from at least one connection point between two resonators, is Ground.

17. Oscillator according to claim 1, characterized in that the first and second vector directions are not substantially the same.

* * * * *